(12) United States Patent
Chen et al.

(10) Patent No.: US 6,987,044 B2
(45) Date of Patent: Jan. 17, 2006

(54) VOLATILE MEMORY STRUCTURE AND METHOD FOR FORMING THE SAME

(75) Inventors: Shih-Lung Chen, Taipei (TW); Yueh-Chuan Lee, Nantou (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/669,346

(22) Filed: Sep. 25, 2003

(65) Prior Publication Data
US 2005/0067646 A1   Mar. 31, 2005

(51) Int. Cl.
*H01L 27/148* (2006.01)
*H01L 29/768* (2006.01)

(52) U.S. Cl. ............ 438/243; 438/241; 438/242; 438/244; 438/245; 438/246; 438/247; 438/248

(58) Field of Classification Search ......... 438/242, 438/243–253
See application file for complete search history.

(56) References Cited

U.S. PATENT DOCUMENTS

| | | | | |
|---|---|---|---|---|
| 4,801,988 A | * | 1/1989 | Kenney | 257/304 |
| 5,097,381 A | * | 3/1992 | Vo | 361/313 |
| 5,736,760 A | * | 4/1998 | Hieda et al. | 257/301 |
| 5,909,044 A | * | 6/1999 | Chakravarti et al. | 257/301 |
| 6,184,549 B1 | * | 2/2001 | Furukawa et al. | 257/302 |

* cited by examiner

Primary Examiner—Steven Loke
Assistant Examiner—Samuel A. Gebremariam
(74) Attorney, Agent, or Firm—Birch, Stewart, Kolasch & Birch, LLP

(57) ABSTRACT

A method for forming a volatile memory structure. A buried trench capacitor in each of a pair of neighboring trenches formed in a substrate. An asymmetric collar insulating layer is formed over an upper portion of the sidewall of each trench and has a high and a low level portions. A conductive layer is formed overlying the buried trench capacitor and below the surface of the substrate. The high level portion is adjacent to the substrate between the neighboring trenches and the low level portion is covered by the conductive layer. A dielectric layer is formed overlying the conductive layer. Two access transistors are formed on the substrate outside of the pair of the neighboring trenches, respectively, which have source/drain regions electrically connecting to the conductive layer. A volatile memory structure is also disclosed.

12 Claims, 8 Drawing Sheets

VOLATILE MEMORY STRUCTURE AND METHOD FOR FORMING THE SAME

BACKGROUND OF THE INVENTION

1. Field of the Invention

The present invention relates in general to a semiconductor memory device, and more particularly, to a volatile memory structure with an improved buried strap and method for forming the same.

2. Description of the Related Art

A dynamic random access memory (DRAM) device is a typical volatile memory device for integrated circuit devices. A DRAM cell includes an access transistor and a storage capacitor. In the fabrication of the integrated circuit devices, a buried strap has been employed in fabricating deep trench-based DRAM devices. The buried strap is a critical in connecting the storage capacitor to the access transistor. Accordingly, the resistivity of the buried strap and the buried strap width are important factors in providing excellent interconnect properties between transistors and capacitors. The buried strap width is subject to the active area of the deep trench overlay.

FIG. 1 is a cross-section showing a conventional deep trench-based DRAM structure. The DRAM structure includes a substrate 100 having a plurality of pairs of neighboring trenches formed therein. A pair of neighboring trenches 101 is shown for simplicity. Two buried trench capacitors 105 are respectively disposed in a lower portion of each trench 101. The capacitor 105 includes a buried bottom plate 102 formed in the substrate 100 around the lower portion of the trench 101, a top plate 104 disposed in the lower portion of the trench 101, and a capacitor dielectric layer 103 disposed between the buried bottom plate 102 and the top plate 104. Two collar oxide layers 106 are respectively disposed over an upper portion of the sidewall of each trench 101, and two first conductive layers 108 are respectively disposed in the upper portion of each trench 101 and surrounded by the collar oxide layers 106. Two second conductive layers 110 are respectively disposed overlying the collar oxide layer 106 and the first conductive layer 108 in each trench 101. A shallow trench isolation (STI) structure 112 is disposed between the neighboring trenches 101 to serve as an isolation region between the buried trench capacitors 105. Access transistors 114 are disposed overlying the substrate 100 outside of the pair of the neighboring trench 101, which includes a gate 114, a gate dielectric layer 113, and a source/drain region 115. Two gates 117 are respectively disposed on the STI structure 112 over each trench 101.

However, according to the conventional DRAM structure, the width of the first conductive layer 108 and the second conductive layer 110 are narrowed due to formation of the STI structure 112. Therefore, the contact resistance is increased, reducing the saturation drain current and resulting in signal margin failure.

FIG. 2 is a plane view of the pair of the neighboring trenches before forming the STI structure in FIG. 1. Conventionally, in order to leave a space for forming the STI structure, an island photoresist pattern is used for defining the active area AA. However, the precise alignment between the active area AA and the trench 101 is difficult, especially as the size memory devices are continuously reduced. Therefore, the process window of the active area to the trench overlay decreases due to misalignment during lithography.

SUMMARY OF THE INVENTION

Accordingly, an object of the present invention is to provide a novel volatile memory structure and the method for fabricating the same, which reduces the contact resistance of the buried strap layer, thereby increasing the saturation drain current and preventing signal margin failure.

Another object of the present invention is to provide a novel volatile memory structure and the method for fabricating the same, which employs a masking layer to partially remove the collar insulating layer, thereby forming an asymmetric collar insulating layer, instead of the conventional shallow trench isolation (STI) structure, to serve as an isolation region between neighboring trench capacitors.

Still another object of the present invention is to provide a novel volatile memory structure and the method for fabricating the same, the novel structure defines a strap type active area, instead of the conventional island type active area, through use of an improved trench capacitor structure which uses an asymmetric collar insulating layer as an isolation region. The process window of the active area to trench overlay is thereby extended.

In order to achieve the above objects and other advantages, a method for forming a volatile memory is provided. First, a substrate having a pair of neighboring trenches is provided. Next, a buried trench capacitor is formed in a lower portion of each trench. Next, an asymmetric collar insulating layer having a high level portion and a low level portion is formed over an upper portion of the sidewall of each trench and a conductive layer is formed overlying the buried trench capacitor in each trench and below the surface of the substrate with a lower part surrounded by the asymmetric collar insulating layer. The high level portion is adjacent to the substrate between the neighboring trenches and the low level portion is covered by an upper part of the conductive layer. Next, a dielectric layer is formed overlying the conductive layer in each trench. Finally, two access transistors are formed on the substrate outside of the pair of the neighboring trenches, respectively, which have source/drain regions electrically connecting to the conductive layer.

Another aspect of the invention provides a volatile memory structure, which includes a substrate having a pair of neighboring trenches, two buried trench capacitors, two conductive layers, two asymmetric collar insulating layers, two dielectric layers, and two access transistors. The buried trench capacitors are respectively disposed in a lower portion of the neighboring trenches, and the conductive layers are respectively disposed overlying the buried trench capacitor in each trench and below the surface of the substrate. The asymmetric collar insulating layers, having a high level portion and a low level portion, are respectively disposed over an upper portion of the sidewall of the neighboring trenches and surrounding a lower part of the conductive layers. Each high level portion is adjacent to the substrate between the neighboring trenches and each low level portion is covered by an upper part of the conductive layer. The dielectric layers are respectively disposed overlying the conductive layer in each trench and the access transistors are respectively disposed overlying the substrate outside of the pair of the neighboring trenches and have source/drain regions electrically connecting to the conductive layer.

Yet another aspect of the invention provides a method for forming a trench capacitor structure for a volatile memory device. First, a substrate having a trench is provided. Next, a buried bottom plate is formed in the substrate around a lower portion of the trench and a capacitor dielectric layer is then formed over a lower portion of the sidewall of the trench. Next, a top plate is formed in the trench and surrounded by the capacitor dielectric layer. Thereafter, an asymmetric collar oxide layer, having a high level portion and a low level portion, is formed over an upper portion of the sidewall of the trench and a conductive layer is formed, overlying the top plate in the trench, below the surface of the substrate with a lower part of the conductive layer surrounded by the asymmetric collar oxide layer. The low level portion of the asymmetric collar oxide layer is covered by an upper part of the conductive layer. Finally, a dielectric layer is formed overlying the conductive layer in the trench.

Yet another aspect of the invention provides a trench capacitor structure for volatile memory device, which includes a substrate having a trench, a buried bottom plate, a capacitor dielectric layer, a top plate, a conductive layer, an asymmetric collar oxide layer, and a dielectric layer. The buried bottom plate is formed in the substrate around a lower portion of the trench and the capacitor dielectric layer is disposed in the lower portion of the trench. The top plate is disposed in the trench and surrounded by the capacitor dielectric layer. The conductive layer is disposed overlying the top plate in the trench and below the surface of the substrate. The asymmetric collar oxide layer, having a low level portion covered by an upper part of the conductive layer, is disposed over an upper portion of the sidewall of the trench and surrounding a lower part of the conductive layer. The dielectric layer is disposed overlying the conductive layer in the trench.

Further scope of the applicablility of the present invention will become apparent from the detailed description gien hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings, which are given by way of illustration only and thus not intended to be limitative of the present invention, and wherein.

DETAILED DESCRIPTION OF THE INVENTION

Figure 1:
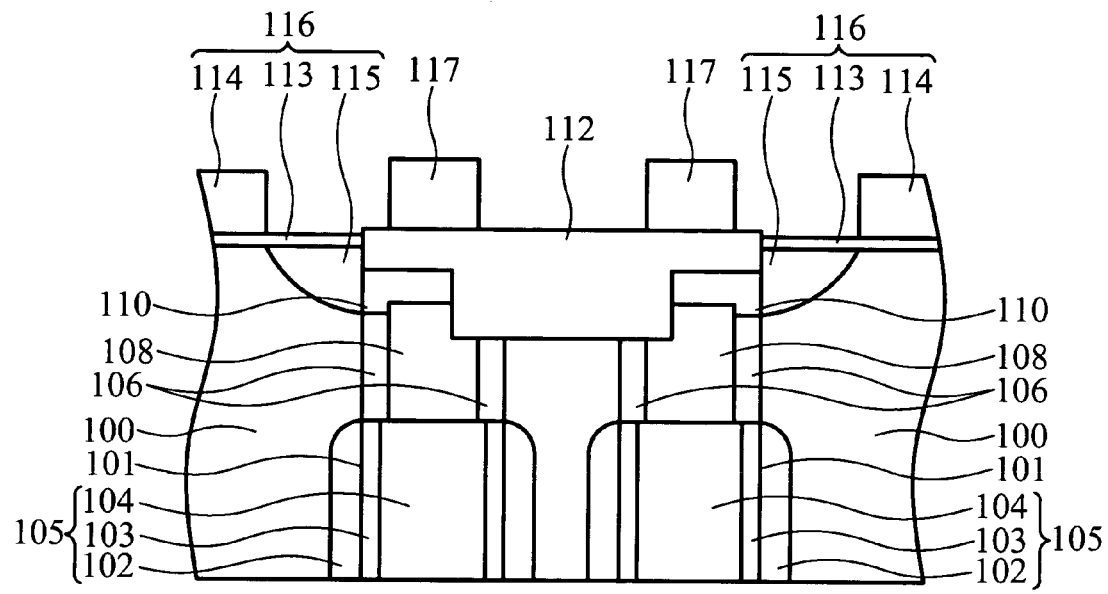
FIG. 1 is a cross-section showing a conventional deep trench-based DRAM structure.

FIGS. 3a to 3h are cross-sections showing a method for forming a volatile memory structure, such as a DRAM structure. First, in FIG. 3a, a substrate 200, such as a silicon wafer, is provided. A hardmask layer 203 is formed on the substrate 200. The hardmask layer 203 can be composed of a pad oxide layer 201 and an overlying silicon nitride layer 202 and optional an oxide layer (not shown) overlying the silicon nitride layer 202. The pad oxide layer 201 can be formed by thermal oxidation or conventional chemical vapor deposition (CVD). Moreover, the silicon nitride layer 202 overlying the pad oxide layer 201 can be formed by low pressure CVD (LPCVD) using $SiCl_2H_2$ and $NH_3$ as reaction sources.

Next, a plurality of openings is formed in the hardmask layer 203 by lithography and etching. Thereafter, anisotropic etching, such as reactive ion etching (RIE), is performed on the substrate 200 using the hardmask layer 203 as an etch mask to form a plurality of trenches therein. In order to simplify the diagram, only a pair of neighboring trenches 204 is shown.

Next, two buried trench capacitors 208 are respectively formed in a lower portion of each trench 204. The formation of the buried trench capacitors 208 includes the following steps. First, a buried bottom plate 205 is formed in the substrate around the lower portion of the trench 204. Next, a capacitor dielectric layer 206, such as a silicon nitride/silicon oxide (NO) layer or a silicon oxide/silicon nitride/silicon oxide (ONO) layer, is conformably formed over the lower portion of the sidewall of the trench 204. Finally, a top plate 207, such as a doped polysilicon layer, is formed in the lower portion of the trench 204 and surrounded by the capacitor dielectric layer 206.

Next, a conformal insulating layer 210, such as a silicon oxide layer, is deposited overlying the hardmask layer 203 and an upper portion of the inner surface of each trench 204 by conventional deposition, such as CVD.

Figure 3A:
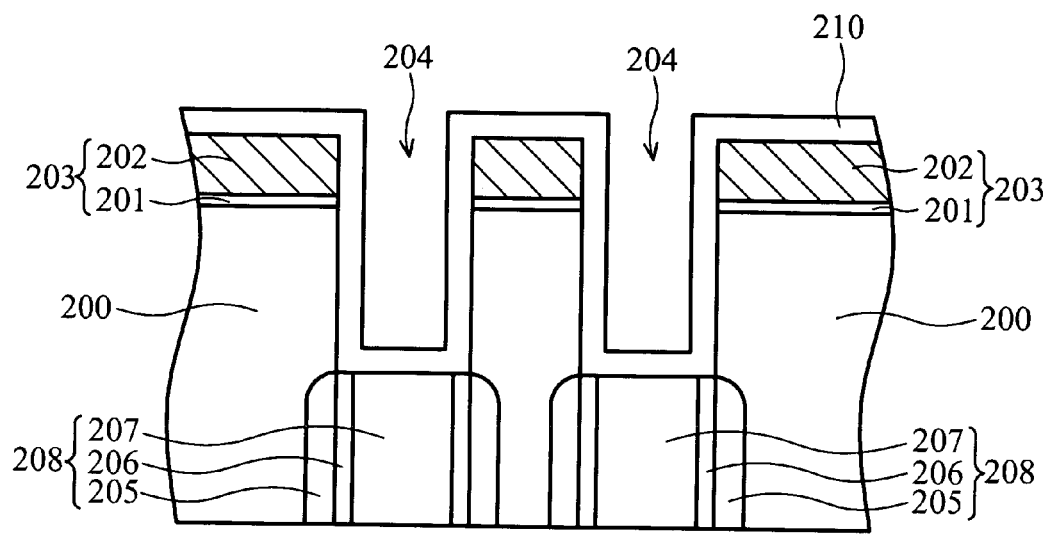
FIGS. 3a to 3h are cross-sections showing a method for forming a volatile memory structure according to the invention.
Figures 1, 3B:
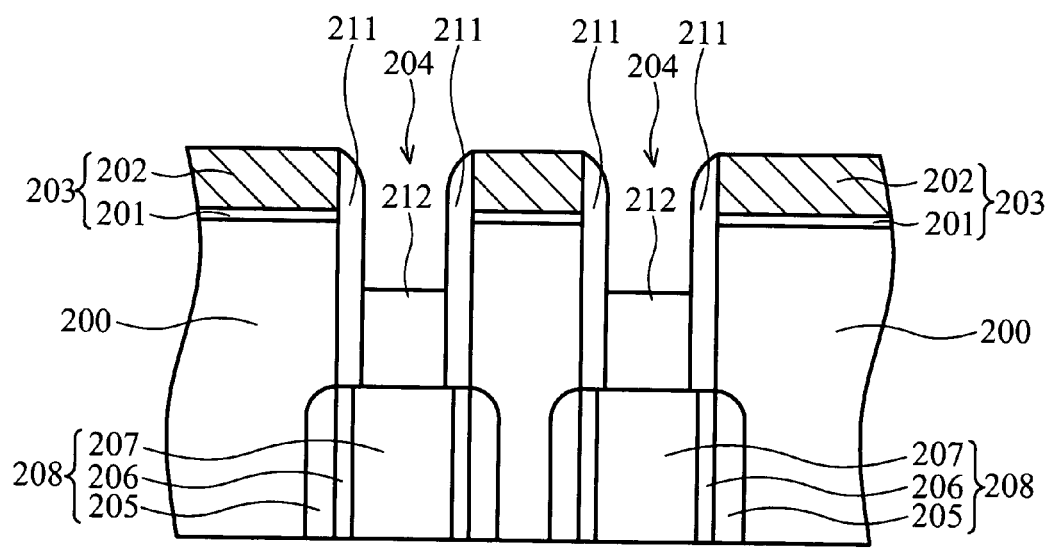
Figures 1, 3C:
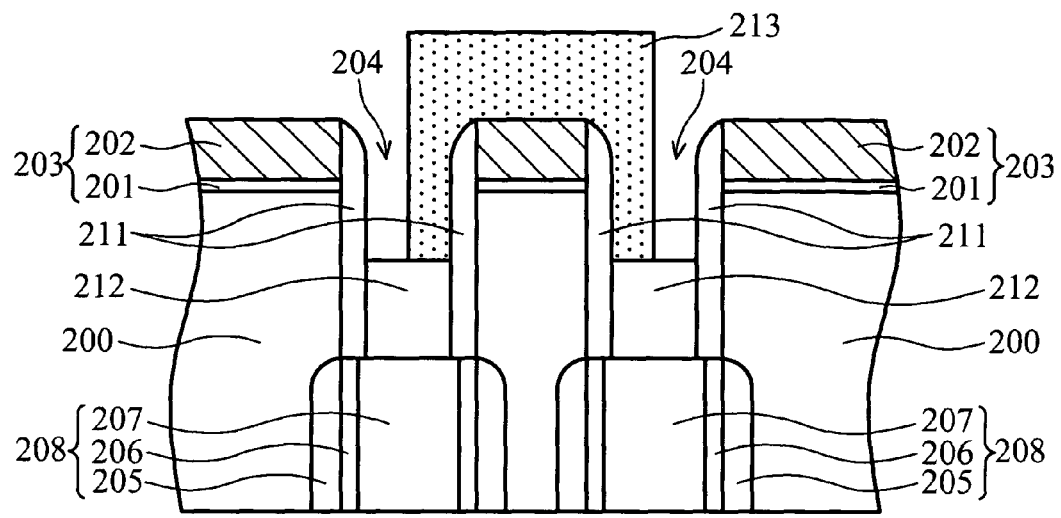
Figures 1, 3D:
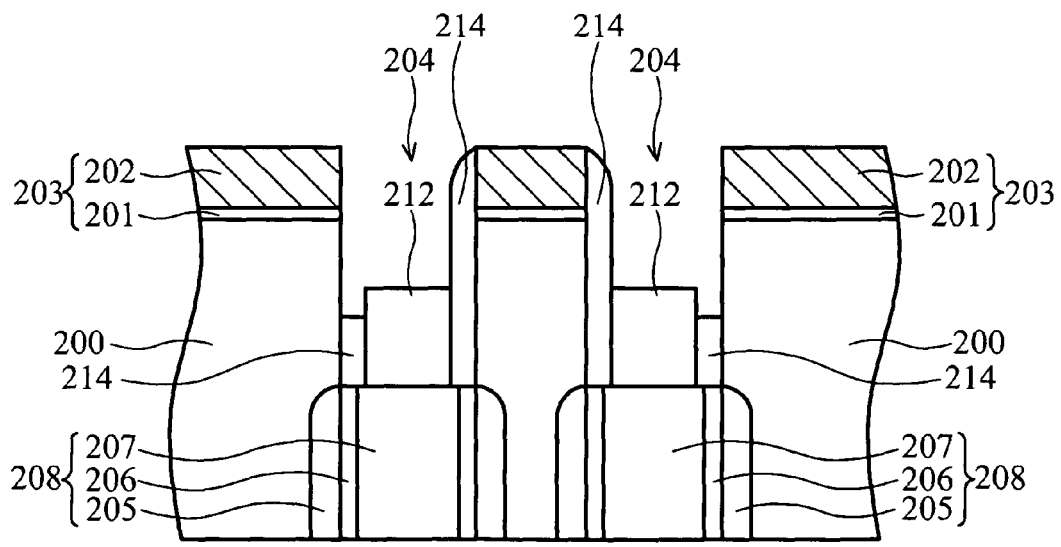
Figures 1, 3E:
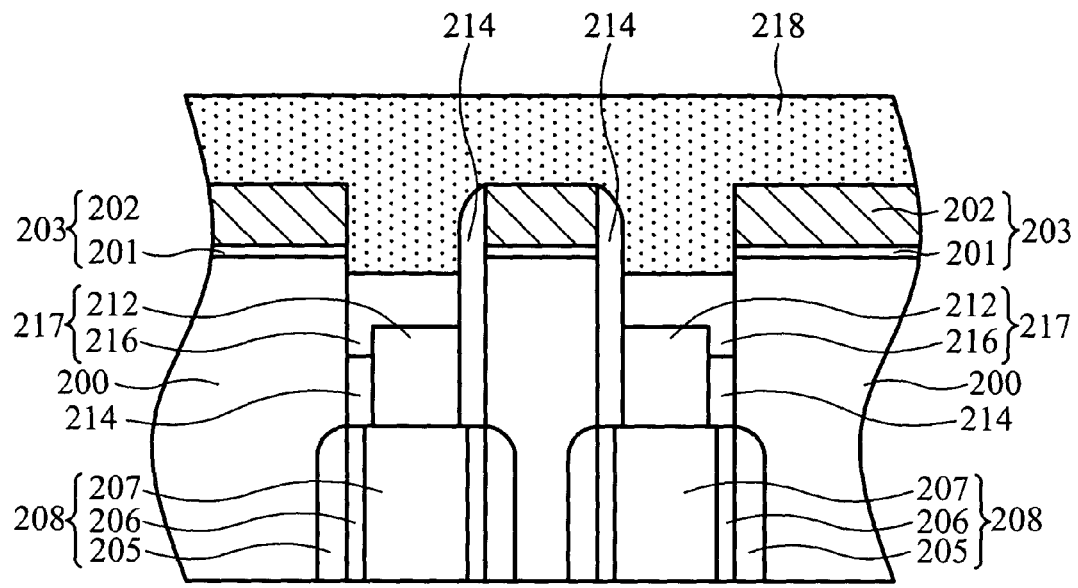
Figures 2, 3B:
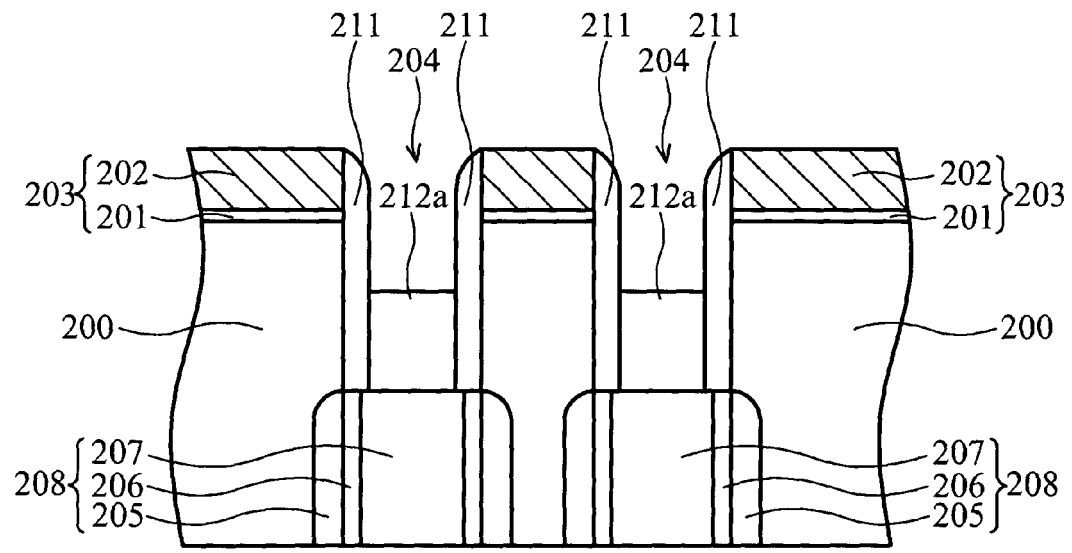
Figures 2, 3C:
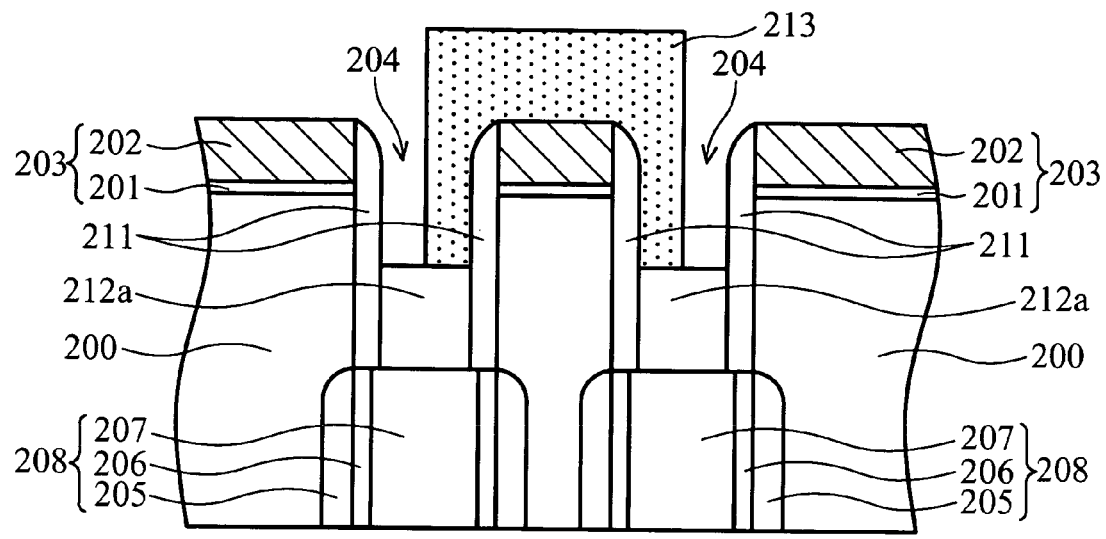
Figures 2, 3D:
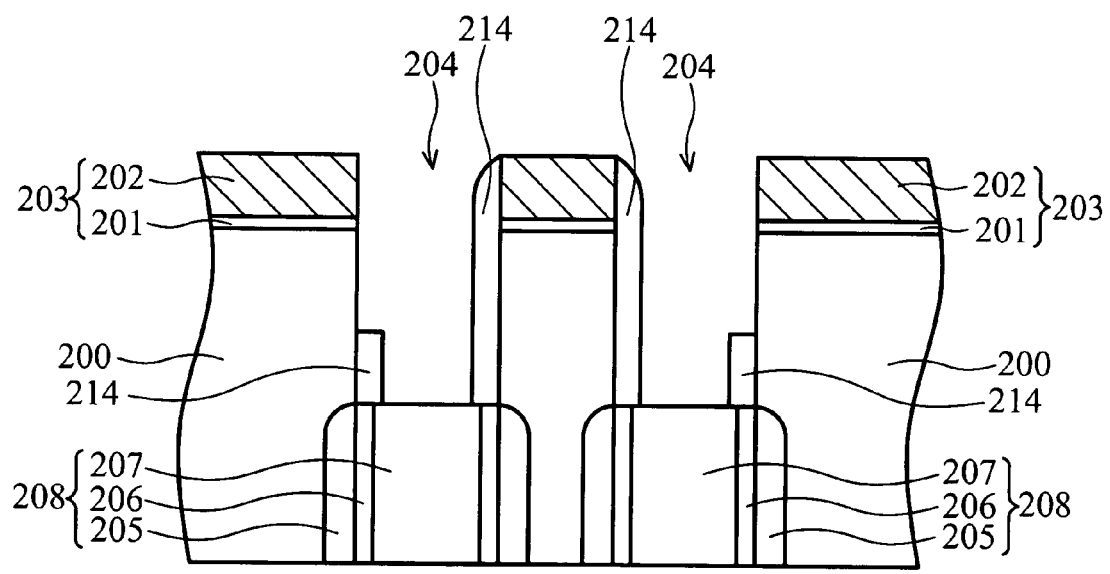
Figures 2, 3E:
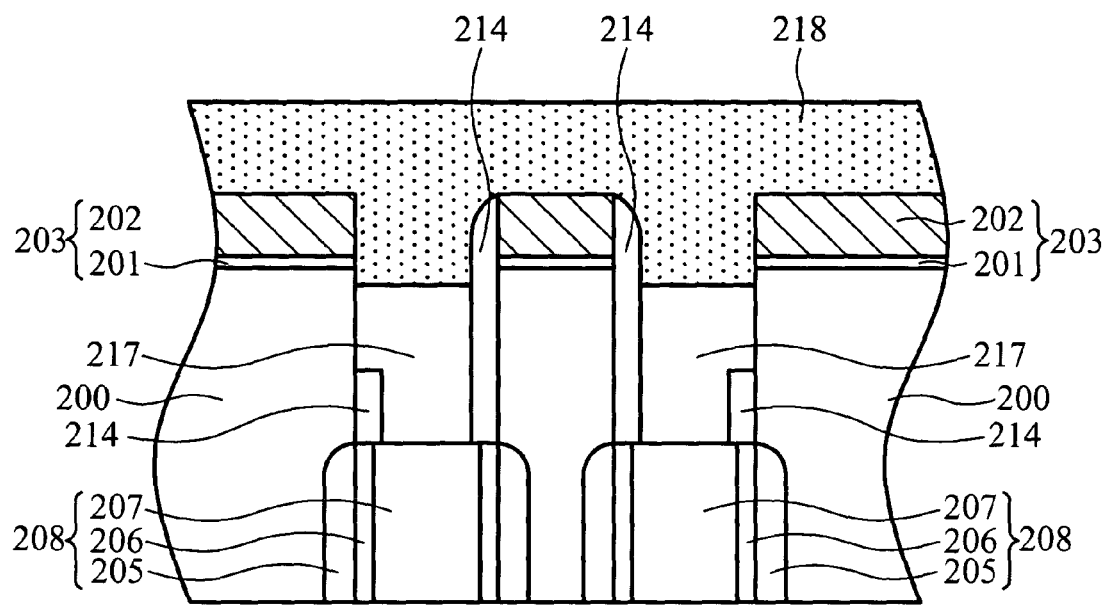

Next, referring to FIGS. 3b-1 to 3e-1, which are cross-sections showing a method for forming an asymmetric collar insulating layer for a volatile memory structure according to one embodiment of the invention. In FIG. 3b-1, anisotropic etching, such as RIE, is performed on the insulating layer 210 to form an insulating spacer 211 over the upper portion of the sidewall of each trench 204. Next, a first conductive layer (not shown), such as a doped polysilicon layer, is formed overlying the hardmask layer 203 and fills in each trench 204. Thereafter, the first conductive layer is recessed by etching to leave a portion of the first conductive layer 212 surrounded by the insulating spacer 211 protruding the surface of the first conductive layer 212 in each trench 204.

Figure 4A:
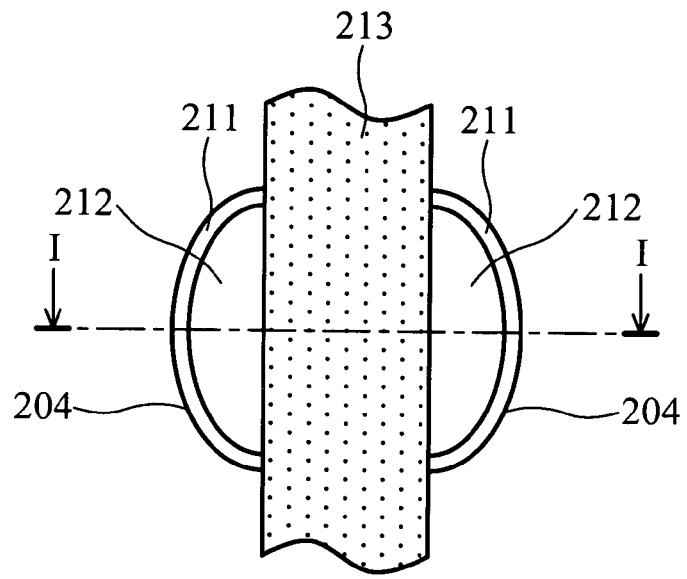
FIG. 4a is a plane view showing the step of covering portions of the insulating spacers in FIG. 3c.

Next, referring to the FIGS. 3c-1 and 4a, wherein FIG. 4a is a plane view showing the following steps and FIG. 3c-1 is a cross-section along line I—I in FIG. 4a. A masking layer 213, such as a photoresist layer, overlying the hardmask layer 203 between the neighboring trenches 204 is formed through lithography process, which covers portions of the insulating spacers 211 adjacent to the substrate 200 between the neighboring trenches 204. Next, the uncovered insulating spacers 211 are removed by, for example, wet chemical etching, and then the masking layer 213 is removed, as shown in FIG. 3d-1. As a result, the asymmetric collar insulating layer 214 is formed in each trench 204 after etching, to serve as an isolation region between neighboring buried trench capacitors 208. The asymmetric collar insulating layer 214 has a high level portion and a low level portion where the high level one is adjacent to the substrate 200 between the neighboring trenches 204. In the invention, the masking layer 213 can be a strap type pattern or any other pattern, which can cover about half of the insulating spacer 211 in each trench 204.

Figure 4B:
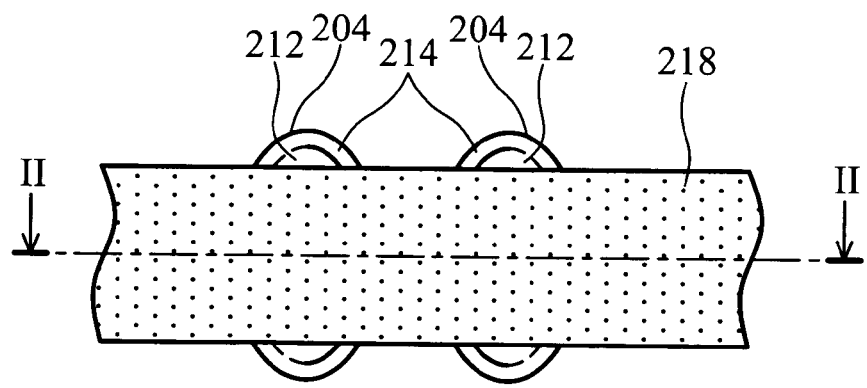
FIG. 4b is a plane view showing the step of defining the active area in FIG. 3e.

Next, referring to the FIGS. 3e-1 and 4b, wherein FIG. 4b is a plane view of showing the following steps and FIG. 3e-1 is a cross-section along line II—II in FIG. 4b. A second conductive layer (not shown), such as a doped polysilicon layer, is formed overlying the hardmask layer 203 and fills the trenches 204 by conventional deposition, such as CVD. Thereafter, the second conductive layer is etched to below the surface of the substrate 200, leaving a portion of the second conductive layer 216 overlying the first conductive layer 212 and covering the low level portion of the asymmetric collar insulating layer 214. In the invention, the remaining conductive layers 212 and 216 are combined as a conductive layer 217.

Next, active/isolation areas are defined and formed through an active area masking layer 218, such as a photoresist layer formed by lithography process. In the invention, since the asymmetric collar insulating layer 214 is used as an isolation region, instead of the conventional STI structure, the active area masking layer 218 can be a strap type pattern, instead of the conventional island pattern. The process window of the active area to the trench overlay is thereby extended.

Figure 2:
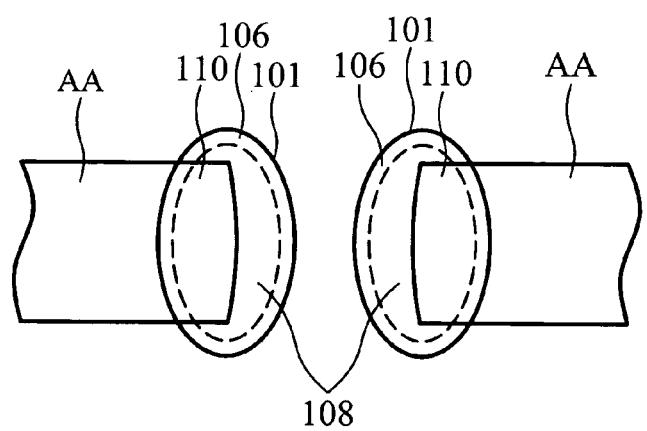
FIG. 2 is a plane view of the pair of the neighboring trenches before forming the STI structure in FIG. 1.

Next, referring to FIGS. 3b-2 to 3e-2, which are cross-sections showing a method for forming an asymmetric collar insulating layer for a volatile memory structure according to another embodiment of the invention. In FIG. 3b-2, anisotropic etching, such as RIE, is performed on the insulating layer 210 to form an insulating spacer 211 over the upper portion of the sidewall of each trench 204. Next, a sacrificial layer (not shown), such as a photoresist or anti-reflection layer, is formed overlying the hardmask layer 203 and fills in each trench 204. If a photoresist is selected as the sacrificial layer, additional baking or curing process may be necessary to change its property to be not radiation sensitive. Thereafter, the sacrificial layer is recessed to leave a portion of the sacrificial layer 212a surrounded by the insulating spacer 211 protruding the surface of the sacrificial layer 212a in each trench 204. Next, in FIG. 3c-2, a masking layer 213, such as a photoresist layer, overlying the hardmask layer 203 between the neighboring trenches 204 is formed through lithography process, which covers portions of the insulating spacers 211 adjacent to the substrate 200 between the neighboring trenches 204. Next, the uncovered insulating spacers 211 are removed by, for example, wet chemical etching, and then the masking layer 213 and the sacrificial layer 212a are removed, as shown in FIG. 3d-2. As a result, the asymmetric collar insulating layer 214 is formed in each trench 204 after etching, to serve as an isolation region between neighboring buried trench capacitors 208. The asymmetric collar insulating layer 214 has a high level portion and a low level portion where the high level one is adjacent to the substrate 200 between the neighboring trenches 204. In the invention, the masking layer 213 can be a strap type pattern or any other pattern, which can cover about half of the insulating spacer 211 in each trench 204.

Next, in FIG. 3e-2, a conductive layer (not shown), such as a doped polysilicon layer, is formed overlying the hardmask layer 203 and fills the trenches 204 by conventional deposition, such as CVD. Thereafter, the conductive layer is etched to leave a portion of the conductive layer 217, overlying the buried trench capacitor 208, below the surface of the substrate 200 with a lower part of the conductive layer 217 surrounded by the asymmetric collar insulating layer 214 and an upper part of the conductive layer 217 covering the low level portion of the asymmetric collar insulating layer 214.

Next, active/isolation areas are defined and formed through an active area masking layer 218, such as a photoresist layer formed by lithography process. In the invention, since the asymmetric collar insulating layer 214 is used as an isolation region, instead of the conventional STI structure, the active area masking layer 218 can be a strap type pattern, instead of the conventional island pattern. The process window of the active area to the trench overlay is thereby extended.

Figure 3F:
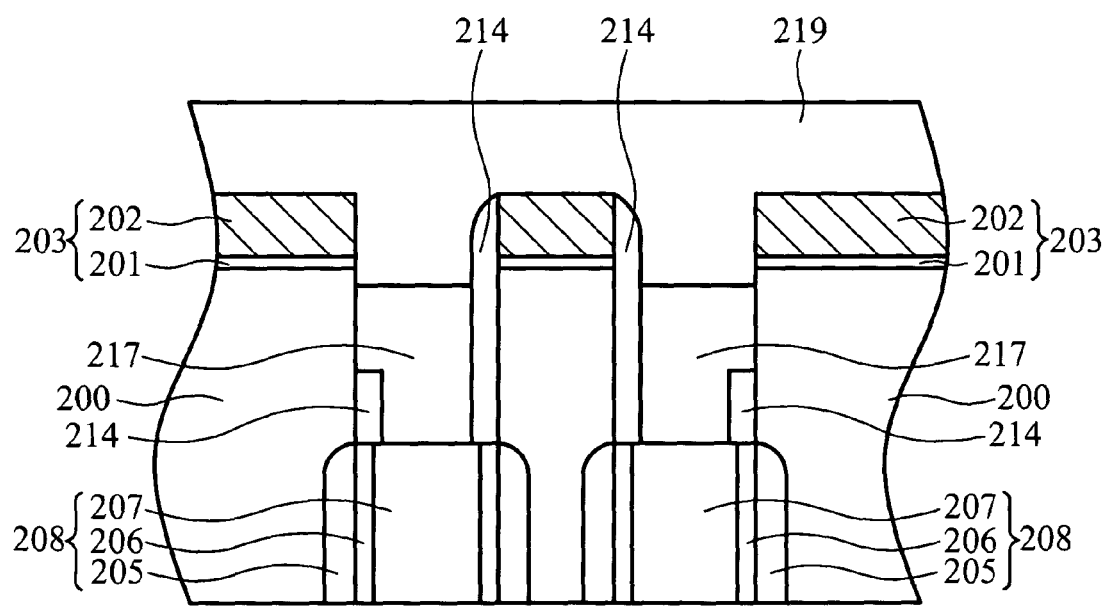

Next, in FIG. 3f, the active area masking layer 218 is removed. A dielectric layer 219, such as an oxide layer, is formed overlying the hardmask layer 203 and fills the neighboring trenches 204 and isolation area (not shown). In the invention, the dielectric layer 219 can be formed by CVD using tetraethyl orthosilicate (TEOS) as a reactant or by high-density plasma CVD (HDPCVD).

Figure 3G:
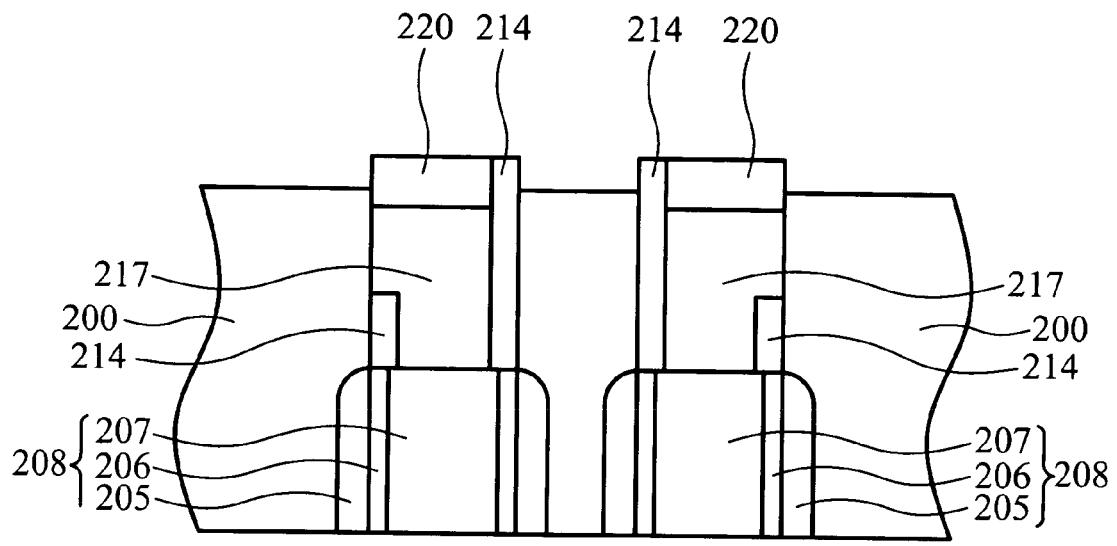

Next, in FIG. 3g, the excess dielectric layer 219 over the hardmask layer 203 is removed by, for example, chemical mechanical polishing (CMP) using the hardmask layer 203 as a stop layer to leave a portion of the dielectric layer 220 overlying the conductive layer 217. Thereafter, the hardmask layer 203 is removed to complete the storage trench capacitor structure of the invention.

Figure 3H:
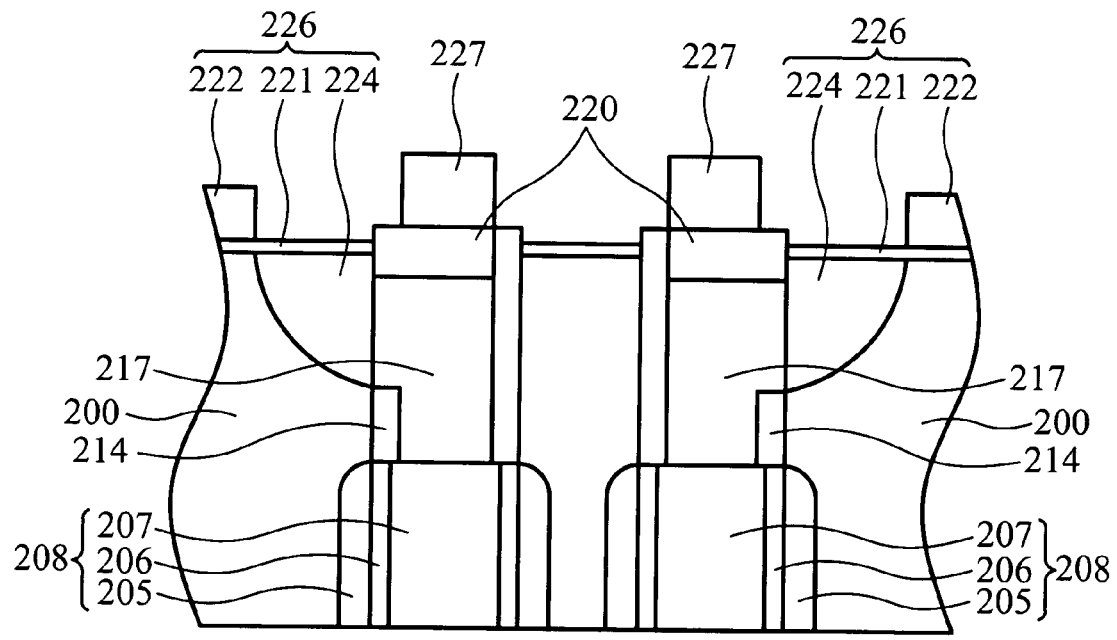

Finally, in FIG. 3h, a dielectric layer 221 is formed on the substrate 200. Here, the dielectric layer 221 can be a silicon oxide layer formed by thermal oxidation or other deposition to serve as a gate dielectric layer for subsequent fabrication of transistors. Next, a plurality of gates 222 and 227 is formed overlying the substrate 200, wherein the gates 222 are formed on the dielectric layer 221 outside of the pair of the neighboring trenches 204 and the gates 227 are respectively formed on the dielectric layer 220 over the trenches 204. Next, source/drain regions 224 are formed in the substrate 200 at both sides of each gate 222 by ion implantation, which electrically connect to the conductive layer 217, to complete the fabrication of the access transistors 226.

FIG. 3h shows a volatile memory structure. The memory structure includes a substrate 200, two buried trench capacitors 208, two conductive layers 217, two asymmetric collar insulating layers 214, two dielectric layers 220, and two access transistors 226. The substrate 200 has a pair of neighboring trenches 204 formed therein.

Buried trench capacitors 208 are respectively disposed in a lower portion of the neighboring trenches 204. The buried trench capacitor 208 includes a buried bottom plate 205, a capacitor dielectric layer 206, and a top plate 207. The buried bottom plate is a doping region formed in the substrate 200 around the lower portion of the trench 204. The capacitor dielectric layer 206 can be a silicon nitride/silicon oxide (NO) layer or a silicon oxide/silicon nitride/silicon oxide (ONO) layer, which is disposed in the lower portion of the trench 204. The top plate 207 can be a polysilicon layer, which is disposed in the trench 204 and surrounded by the capacitor dielectric layer 206.

Two conductive layers 217, such as doped polysilicon layers, are respectively disposed overlying the buried trench capacitor 208 in each trench 204 and below the surface of the substrate 200.

Two asymmetric collar insulating layers 214, such as silicon oxide layers, having a high level portion and a low level portion, are respectively disposed over an upper portion of the sidewall of the neighboring trenches 204 and surrounding a lower part of the conductive layer 217, wherein each high level portion is adjacent to the substrate between the neighboring trenches 204 and each low level portion is covered by an upper part of the conductive layer 217.

Two dielectric layers 220 are respectively disposed overlying the conductive layer 217 in each trench 204, which can be formed by CVD. Moreover, two optional gates 227 are respectively disposed overlying the dielectric layer 220 over each trench 204.

Two access transistors 226 are disposed overlying the substrate 200 outside the pair of neighboring trenches 204, which include the gate dielectric layers 221, gates 222 and source/drain regions 224 electrically connecting to the conductive layers 217, respectively.

According to the invention, the asymmetric collar insulating layer is used as an isolation region between the pair of neighboring buried trench capacitors, instead of the conventional STI structure in the prior art. Accordingly, the width of the conductive layer can be increased, thereby reducing its contact resistance to further increase saturation current of the access transistors in memory devices and prevent signal margin failure.

Moreover, the active area of the invention is defined by a strap type pattern, instead of the island pattern used in the prior art. Accordingly, the process window of the active area to the trench overlay is thereby extended.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an asymmetric insulating layer for a volatile memory structure, comprising the steps of:
   providing a substrate having a pair of neighboring trenches;
   forming a buried trench capacitor in a lower portion of each trench;
   forming an asymmetric collar insulating layer, having a high level portion and a low level portion, over an upper portion of the sidewall of each trench, and forming a conductive layer, overlying the buried trench capacitor in each trench, below the upper surface of the substrate with a lower part of the conductive layer surrounded by the asymmetric collar insulating layer, wherein the high level portion of the asymmetric collar insulating layer is adjacent to the substrate between the neighboring trenches and the low level portion is covered by an upper part of the conductive layer, wherein the step of forming the asymmetric collar insulating layer comprises:
   forming a sacrificial layer in each trench, the sacrificial layer overlying the buried trench capacitor and being surrounded by an insulating spacer protruding the surface of the sacrificial layer;
   covering portions of the insulating spacers adjacent to the substrate between the neighboring trenches by a masking layer;
   removing the uncovered insulating spacers to form the asymmetric collar insulating layer; and
   successively removing the masking layer and the sacrificial layer;
   forming a dielectric layer overlying the conductive layer in each trench; and
   forming access transistors on the substrate outside of the pair of the neighboring trenches, respectively, wherein each access transistor has source or drain region electrically connecting to the conductive layer.

2. The method as claimed in claim 1, wherein the sacrificial layer is a photoresist or anti-reflection layer.

3. The method as claimed in claim 1, wherein the masking layer is a photoresist layer.

4. The method as claimed in claim 1, wherein the conductive layer is a doped polysilicon layer.

5. The method as claimed in claim 1, wherein before the step of forming the dielectric layer, further comprises:
   forming active area/isolation areas through an active area masking layer.

6. The method as claimed in claim 5, wherein the active area masking layer is a strap type pattern.

7. A method for forming a trench capacitor structure for a volatile memory device, comprising the steps of:
   providing a substrate having a trench;
   forming a buried bottom plate in the substrate around a lower portion of the trench;
   forming a capacitor dielectric layer over a lower portion of the sidewall of the trench;
   forming a top plate in the trench and surrounded by the capacitor dielectric layer;
   forming an asymmetric collar oxide layer, having a high level portion and a low level portion, over an upper portion of the sidewall of the trench, and forming a conductive layer, overlying the top plate in the trench, below the upper surface of the substrate with a lower part of the conductive layer surrounded by the asymmetric collar oxide layer, wherein the low level portion of the asymmetric collar oxide layer is covered by an upper part of the conductive layer, wherein the step of forming the asymmetric collar oxide layer comprises:
   forming a sacrificial layer in the trench, the sacrificial layer overlying the top plate in the trench and being surrounded by an oxide spacer protruding the surface of the sacrificial layer;
   covering a portion of the oxide spacer by a masking layer;
   removing the uncovered oxide spacer to form the asymmetric collar oxide layer; and
   successively removing the masking layer and the sacrificial layer; and
   forming a dielectric layer overlying the conductive layer in the trench.

8. The method as claimed in claim 7, wherein the sacrificial layer is a photoresist or anti-reflection layer.

9. The method as claimed in claim 7, wherein the masking layer is a photoresist layer.

10. The method as claimed in claim 7, wherein the conductive layer is a doped polysilicon layer.

11. The method as claimed in claim 7, wherein before the step of forming the dielectric layer, further comprises:
    forming active area/isolation areas through an active area masking layer.

12. The method as claimed in claim 11, wherein the active area masking layer is a strap type pattern.

* * * * *